United States Patent
Chen

(10) Patent No.: US 9,373,403 B1
(45) Date of Patent: Jun. 21, 2016

(54) 3D NAND MEMORY DEVICE AND OPERATION THEREOF

(71) Applicant: MACRONIX INTERNATIONAL CO., LTD., Hsinchu (TW)

(72) Inventor: Shih-Hung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/790,461

(22) Filed: Jul. 2, 2015

(51) Int. Cl.
G11C 16/04 (2006.01)
G11C 16/06 (2006.01)
G11C 5/06 (2006.01)
G11C 16/10 (2006.01)

(52) U.S. Cl.
CPC .................................... *G11C 16/10* (2013.01)

(58) Field of Classification Search
CPC .......... G11C 16/0483; G11C 2213/71; G11C 16/0466; G11C 16/0491; G11C 16/3418; G11C 11/16; G11C 13/0023; G11C 2213/72; G11C 5/02; G11C 5/063
See application file for complete search history.

(56) References Cited

U.S. PATENT DOCUMENTS

| | | |
|---|---|---|
| 6,906,940 B1 | 6/2005 | Lue |
| 7,315,474 B2 | 1/2008 | Lue |
| 7,420,242 B2 | 9/2008 | Lung |
| 7,696,559 B2 | 4/2010 | Arai et al. |
| 7,851,849 B2 | 12/2010 | Kiyotoshi |
| 8,363,476 B2 | 1/2013 | Lue et al. |
| 8,467,219 B2 | 6/2013 | Lue |
| 8,503,213 B2 | 8/2013 | Chen et al. |
| 8,759,899 B1 | 6/2014 | Lue et al. |
| 2005/0280061 A1 | 12/2005 | Lee |
| 2007/0045708 A1 | 3/2007 | Lung |
| 2007/0252201 A1 | 11/2007 | Kito et al. |
| 2008/0073635 A1 | 3/2008 | Kiyotoshi et al. |
| 2008/0175032 A1 | 7/2008 | Tanaka et al. |
| 2008/0180994 A1 | 7/2008 | Katsumata et al. |
| 2009/0097321 A1 | 4/2009 | Kim et al. |
| 2009/0184360 A1 | 7/2009 | Jin et al. |
| 2010/0270593 A1 | 10/2010 | Lung et al. |
| 2012/0119283 A1 | 5/2012 | Lee et al. |
| 2012/0182806 A1* | 7/2012 | Chen ................. H01L 27/11573 365/185.17 |
| 2015/0009759 A1* | 1/2015 | Lai ......................... G11C 16/06 365/185.17 |

FOREIGN PATENT DOCUMENTS

EP 2048709 A2 4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, p. 91-92.

(Continued)

*Primary Examiner* — Hien Nguyen
(74) *Attorney, Agent, or Firm* — Haynes Beffel & Wolfeld LLP

(57) ABSTRACT

The present invention relates to 3D memory devices and methods for programming such devices, and more particularly to memory devices having control circuitry which is responsive to the indicator memory to apply a first control voltage to a selected one of the horizontal structures, apply a second control voltage to a non-selected one of the horizontal structures, and apply a third control voltage to an excluded one of the horizontal structures.

20 Claims, 6 Drawing Sheets

(56) References Cited

OTHER PUBLICATIONS

Choi et al., "Performance Breakthrough in NOR Flash Memory with Dopant-Segregated Schottky-Barrier (DSSB) SONOS Device", 2009 Symposium on VLSI Technology Digest of Technical Papers, Jun. 16-18, 2009, pp. 1-2.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson, Mark, et al., "512-Mb PROM With a Three-Dimensional Array of Diode/Antifuse Memory Cells," IEEE J. of Solid-State Circuits, vol. 38, No. 11, Nov. 2003, 1920-1928.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-Nand Flash Storage", Impact 2011, Taipei, dated Oct. 20, 2011, found at www.impact.org.tw/2011/Files/NewsFile/201111110190.pdf.

* cited by examiner

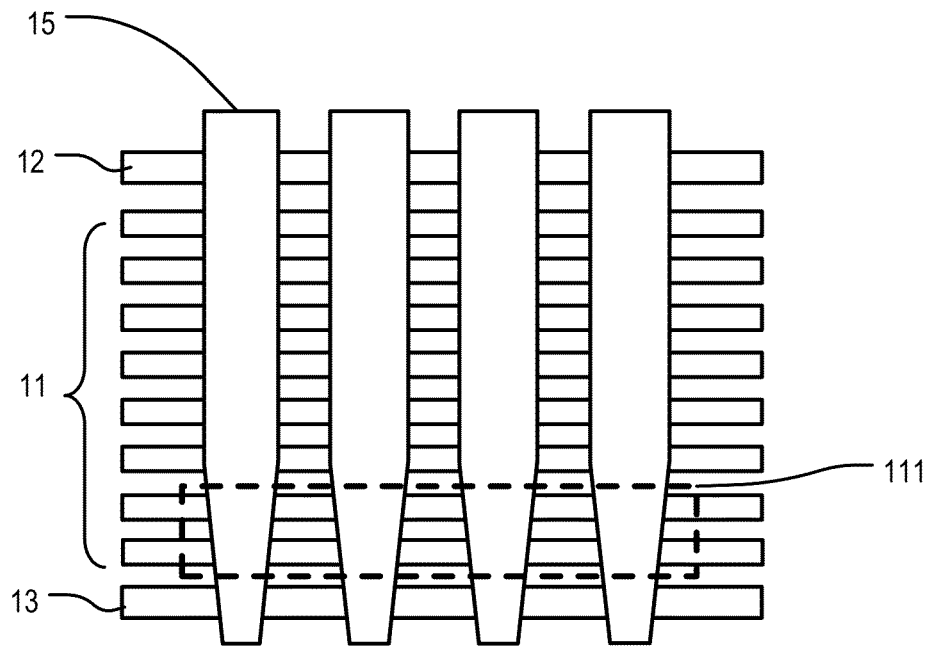
FIG. 4A
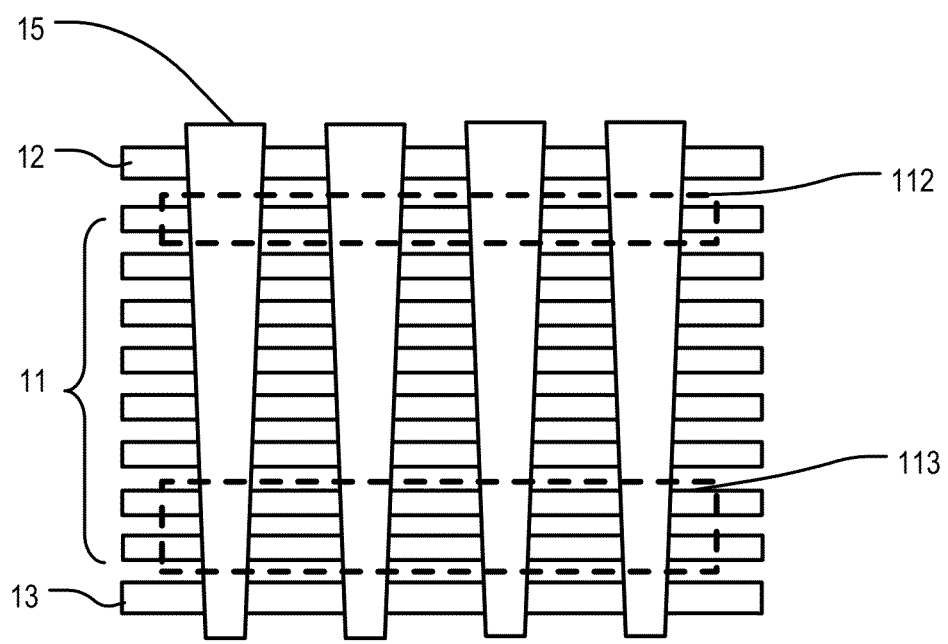
FIG. 4B

3D NAND MEMORY DEVICE AND OPERATION THEREOF

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006, incorporated by reference herein.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In the processes described in Lai, et al., Jung, et al. and Johnson et al., there are several critical lithography steps for each memory layer. Thus, the number of critical lithography steps needed to manufacture the device is multiplied by the number of layers that are implemented. So, although the benefits of higher density are achieved using 3D arrays, the higher manufacturing costs limit the use of the technology.

Another structure that provides vertical NAND cells in a charge trapping memory technology is described in Tanaka et al., "Bit Cost Scalable (BiCS) Technology with Punch and Plug Process for Ultra High Density Flash Memory," 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, and an upper select gate on top. A plurality of horizontal control gates is formed using planar electrode layers that intersect with the pillars. The planar electrode layers used for the control gates do not require critical lithography, and thereby save costs. However, many critical lithography steps are required for each of the vertical cells. Also, there is a limit in the number of control gates that can be layered in this way, determined by such factors as the conductivity of the vertical channel, program and erase processes that are used, and so on.

Yet another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, incorporated by reference herein. The structure described in Katsumata et al. includes a similar gate-all-around memory cell structure as BiCS, but the P-BiCS has a U-shaped NAND string with back gate to reduce parasitic resistance of the bottom portion. The select gate, further, has asymmetric source and drain structures to reduce off-current.

While 3D stacking memory structures hold the promise of greatly increased memory density, they also introduce significant process challenges such as, among other things, the need to etch very deep holes through many layers, and to fill in semiconductor material and multiple dielectric layers to form the pillar. Such "punch and plug" processes make it difficult to form a uniform shape or diameter of the pillars from top to bottom. Moreover, the thickness of the dielectric charge trapping structure varies with the pillar shape. The changes in shape and dielectric thickness enhance the tail distribution of threshold voltages of the memory cells, which leads to poor switching behavior and poor reliability of the memory cells. Further, when the pass voltages apply to the non-selected word lines, the memory cells at the narrower portion of the non-uniform pillar not only suffer the electric field enhancement, but also suffer the Vpass disturbance.

It is therefore desirable to provide a 3D memory device and operating method that decrease the negative impact of the non-uniform pillar on the device, and which are capable of varying the density of the device after the fabrication process.

SUMMARY

Roughly described, a memory device is described comprising a plurality of horizontal structures comprising conductive material, semiconductive material or both, on a substrate; a plurality of vertical structures comprising conductive material, semiconductive material or both, orthogonally arranged with the plurality of horizontal structures; a plurality of memory cells located at cross-points between the pluralities of vertical and horizontal structures; an indicator memory which is programmable to indicate which, if any, of the horizontal structures are to be excluded from use during operation because, for example, detection of defects that can affect reliability of memory cells in the indicated level; and control circuitry coupled to the horizontal structures, wherein for reading or writing of the memory device, the control circuitry which is responsive to the indicator memory applies a first control voltage to a selected one of the horizontal structures, applies a second control voltage to a non-selected one of the horizontal conductive structures, and applies a third control voltage to an excluded one of horizontal structures.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings

BRIEF DESCRIPTION OF THE DRAWINGS

The invention will be described with respect to the specific embodiments thereof, and reference will be made to the drawings, in which:

FIGS. 4A and 4B show vertical cross-sections of a portion of the structure of FIG. 3 according to process variations.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
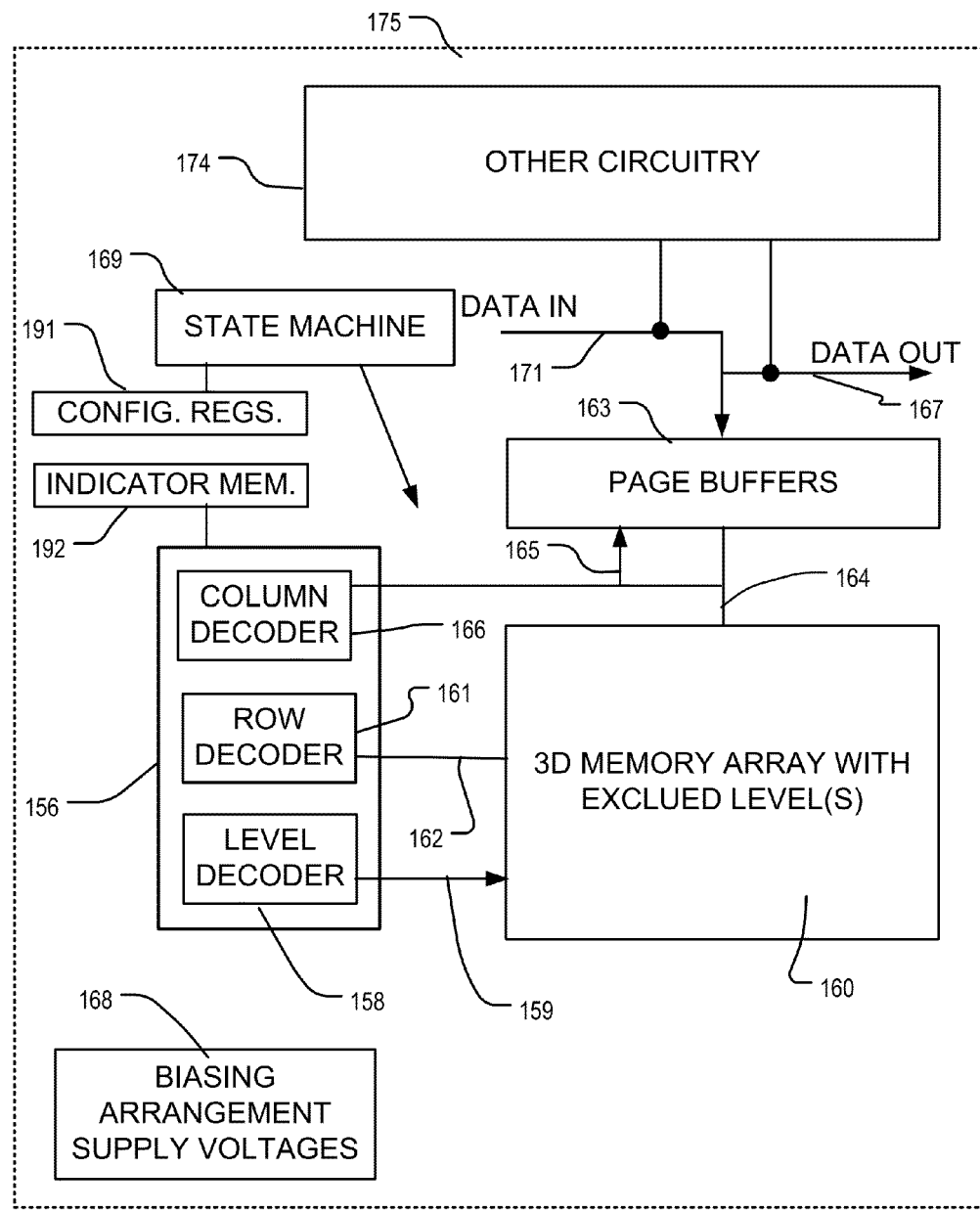
FIG. 1 is a simplified chip block diagram of an integrated circuit 175 incorporating aspects of embodiments.

FIG. 1 is a simplified chip block diagram of an integrated circuit 175 incorporating aspects of embodiments. The integrated circuit 175 includes a 3D memory array 160 and an indicator memory 192 to identify levels in the 3D memory to be excluded from use during operation of the device, implemented as described herein.

An address decoder 156 includes a row decoder 161, column decoder 166 and level decoder 158. The row decoder 161 is coupled to a plurality of SSLs 162 arranged along rows in the memory array 160. The column decoder 166 is coupled to a plurality of bit lines 164 arranged along columns in the memory array 160 for reading and programming data from the memory cells in the array 160. The page buffers 163 are coupled to data-in circuits and data-out circuits via lines 171 and 167, and are coupled to a plurality of bit lines 164 arranged along columns in the memory array 160 for reading data from and writing data to the memory array 160. Addresses are supplied by the address decoder 156 to the page buffers via bus lines 165. In another embodiment, the page buffers can be integrated with the column decoder 166. The level decoder 158 is coupled to a plurality of levels in the memory array 160 via word line connectors 159. An indicator memory 192 is coupled to the address decoder 156 and/or a controller and stores information to indicate the excluded level(s). In yet other embodiments, the indicator memory 192 can be included in the address decoder 156. The indicator memory 192 can be configured in the form of a mask, which masks levels in the 3D blocks from use to store data, while indicating that the masked levels require biasing designed for the excluded levels.

Other circuitry 174 can be included on the chip to support mission functions that utilize the memory. A controller, implemented in this example as a state machine 169, provides signals to control the application of bias arrangement supply voltages generated or provided through the voltage supply or supplies in block 168, such as read, erase, program, erase verify, and program verify voltages to carry out the various operations described herein. A configuration register 191 is coupled to the state machine 169 so as to set the voltage levels to be applied in the program, erase, and read operation and to set the voltage levels to be applied to the excluded levels. The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller. The controller may combine the function of the other circuitry 174 and the state machine 169 to change the voltages through the voltage supply or supplies in block 168.

Figure 2:
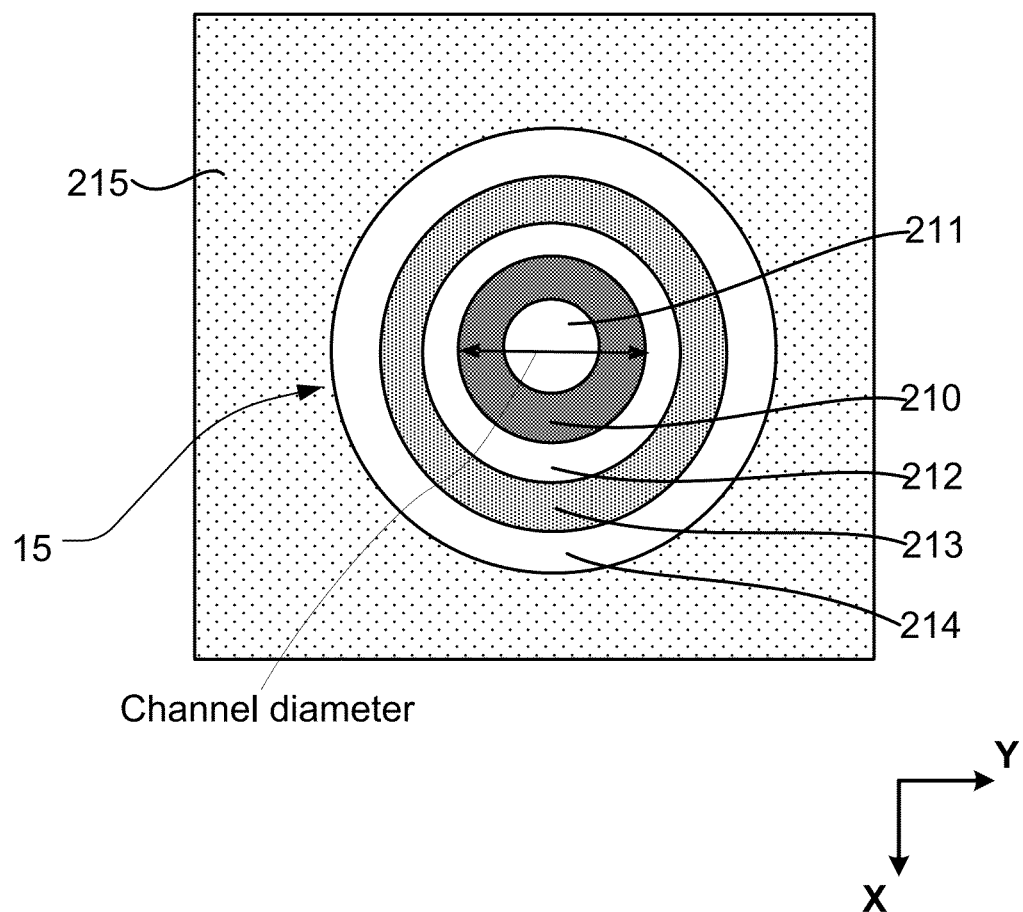
FIG. 2 is a horizontal cross-section of a column of a memory cell in accordance with embodiments.

FIG. 2 is a horizontal cross-section of a column of a memory cell according to the embodiments. The structure includes a pillar 15 having a center core 210 of semiconductor material which extends vertically through a stack of active levels alternating with insulating structures 215, for example, word line layer and insulating layer deposited alternatively. The core 210 may have a seam 211 through the middle that arises from the deposition technique. A dielectric charge trapping structure comprising for example a first layer 212 of silicon oxide, a layer 213 of silicon nitride and a second layer 214 of silicon oxide (referred to as ONO), or another multi-layer dielectric charge trapping structure surrounds the core 210. Series-connected memory cells are located at cross-points between the pillar and each of the active levels. Because of variations in the diameter of the pillar at the levels of the structure, for example, memory cells in some levels may have performance characteristics that fall outside an acceptable range, making use of the cells in that level unreliable or impossible. Such levels can be indicated by programming the indicator memory, and then excluding them from data storage operations.

Figure 3:
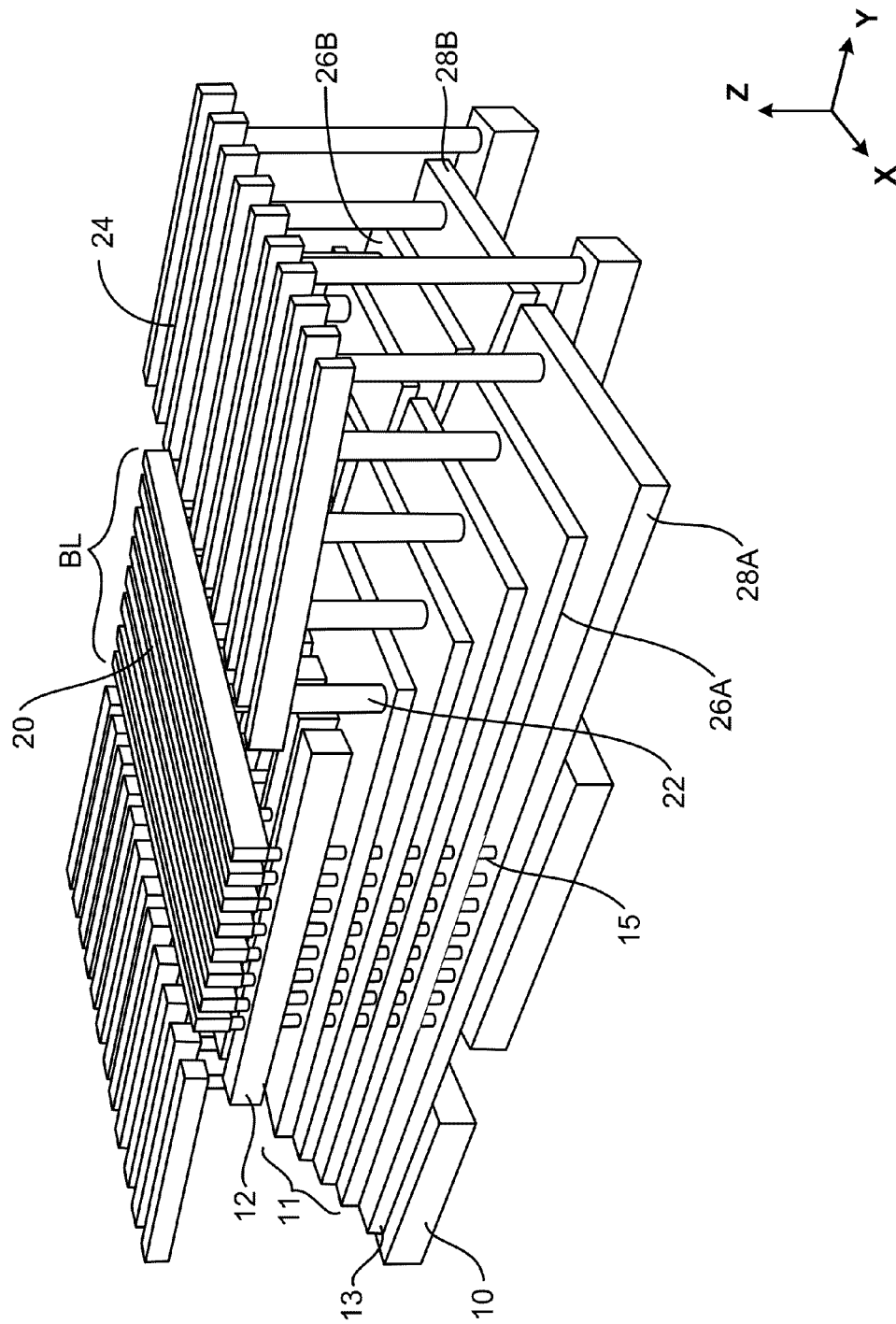
FIG. 3 is a perspective view of a 3D vertical channel memory device.

FIG. 3 is a perspective view of a 3D vertical channel memory device. It comprises a plurality of active levels 11, for example word line layers, each parallel to the substrate, and a plurality of pillars 15 oriented orthogonally to the substrate, each of the pillars comprising a plurality of series-connected memory cells located at cross-points between the pillars and the active levels. A plurality of string select lines (SSLs) 12 are oriented parallel to the substrate and above the active levels 11, with each of the string select lines intersecting a respective row of the pillars. Each intersection of a pillar and a string select line defines a string select gate (SSG) of the pillar. The structure also includes ground select lines (GSLs) 13 (also sometimes called lower select lines, where they are located at the lower end of a pillar), oriented parallel to the substrate and forming a layer below the active levels 11. Each intersection of a pillar and a ground select line 13 defines a ground select gate (GSG) (also sometimes called a lower select gate (LSG) of the pillar. A common source line (CSL) 10 is formed in a layer parallel to the substrate and below the GSLs. The structure also includes a plurality of parallel bit lines 20 in a layer parallel to the substrate and above the string select lines. Each of the bit lines 20 superposes a respective column of the pillars, and each of the pillars 15 underlies one of the bit lines. The pillars 15 may be constructed as described above with respect to FIG. 2.

In FIG. 3, the memory device includes a stairstep contact structure to the active levels. Deep etches are made through the structure in order to form contacts 22 to connect the active level connecting regions 26A and 26B to metal interconnects 24 above. Each connecting region 26A or 26B defines a block of memory cells. Accordingly, respective GSL connecting regions 28A and 28B are provided. Thus, to read data from a particular block of the memory, control circuitry activates an active level connecting regions 26A, 26B to select a block of cells and a particular layer of the stack, and further activates a string select line 12 to select a particular row. A ground select gate is activated as well. A row of cells is then read out in parallel via the bit lines 20 into a page buffer (not shown). ("Activate," as used herein, means to apply a particular bias so as to give effect to the connected cells or switches. The bias may be high or low, depending on the memory design.) Depending on the product specification and design, the page buffer may hold two or more rows of data, in which case a full page read operation would involve successive activation of two or more SSLs 12.

With the punch and plug process, the pillars are formed vertically through all the semiconductive layers, which comprise the plurality of active levels 11, SSLs 12 and GSLs 13. It is critical to form pillars having uniform width from top to bottom. The higher the aspect ratio of the pillar, the less uniform the width of the pillar. The changes in widths of the pillar lead to the variations in the threshold voltages. The bottommost layer of the semiconductive layer is the GSL and the intersection of a pillar and the GSL is a ground select gate (GSG), which performs as a switch to select the respective pillar. Above the GSL are the active levels, and at the intersection of a pillar and the active levels are memory cells. The GSL located in the bottommost layer may have the smallest pillar width, but because all the GSGs are in the same level, the distribution of threshold voltages of GSGs will not be affected seriously by the width change. In contrast, memory cells are located in different levels, and the threshold voltages can be affected by the pillar width or diameter, or other features.

With the changes in the pillar, the distribution of the threshold voltages can become wider so that the tail bits occur. Generally, the memory cells in the array are subject to process variation, resulting in threshold voltages distributed in Gaussian distribution or normal distribution. Memory cells do not follow the normal distribution, resulting in tails in the programmed and erased threshold voltage distribution. These bits are referred to tail bits and they will impact the reliability of the memory.

FIGS. 4A and 4B show vertical cross-sections of a portion of the structure of FIG. 3 according to fabrication process variation. In FIG. 4A, the width of the pillar 15 decreases drastically around the lowermost active levels 11, especially in the block 111. As a result of the narrower width in the block 111, tail bits having higher threshold voltages may occur. To avoid these tail bits affecting the reliability of the memory, the active level in the block 111 is indicated to be excluded. In the memory device, the width of the pillar intersecting the excluded one of the active levels may be smaller than the width of the pillar intersecting the selected and non-selected active levels, which can result in variations in operating characteristics which cause the tail bit problem.

In another example, as is shown in FIG. 4B, the width of the pillar may gradually decrease from top to bottom. Thus, the difference of the width of the pillar around the uppermost and lowermost active levels (see blocks 112 and 113) will widen the distribution of threshold voltages so as to have tail bits with higher threshold voltages. Likewise, in order to avoid tail bits arising from the wide distribution occurring at the narrower or wider width of the pillar, the active levels in the blocks 112 and 113 can be indicated as excluded levels.

Figure 5:
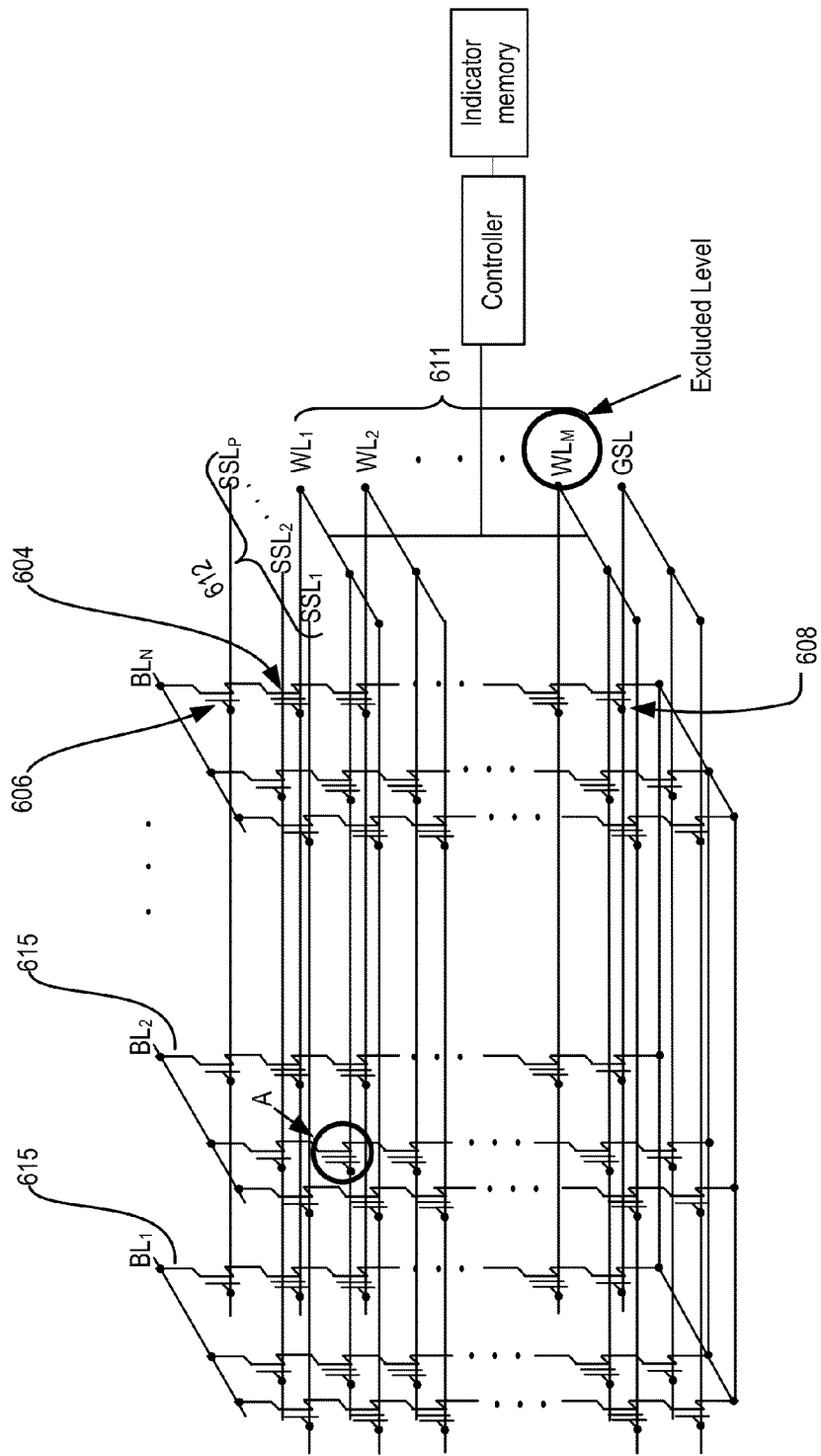
FIG. 5 is a schematic circuit diagram of a block of memory incorporating aspects of the invention.

FIG. 5 is a schematic circuit diagram of a block of memory incorporating aspects of the invention. As shown, the block of memory includes a number $N_{N \times P}$ of strings 615 of series-connected memory cells 604. Each string 615 has a number $N_M$ of memory cells 604. Each of the memory cells 604 is structured as shown in FIG. 1, and electrically includes a source, a drain and a control gate. Because of the electrical interchangeability of source and drain in many transistors, these two terminals are sometimes referred to herein collectively as "current path terminals".

Each of the strings 615 also includes a string select gate 606 and a ground select gate 608 series-connected on opposite sides of the memory cells 604 of the string. The string select gate 606 is for string selection, and the ground select gate 608 prevents cell current through the string during a program operation. More particularly, each string select gate 606 and ground select gate 608 acts as the control gate electrodes the current path terminals of the string.

The block of the memory device includes $N_{WL}$ separate active levels 611, one corresponding to each of the memory cells 604 in a string 615. Each of the active levels 611 functions as the control gate electrode of the corresponding memory cell 604 at that level in all of the strings 615 in the block. The active levels are coupled to the controller which is responsive to the indicator memory to identify the excluded levels. A memory device as described herein comprises an indicator memory which is programmable to indicate which if any of the active levels is to be excluded. The indicator can identify the same excluded levels in all the blocks of the memory device, or identify different excluded levels in the respective block of the memory device.

The block of the memory device includes $N_{SSL}$ separate string select lines 612 coupled to an SSL decoder, which act as the control gate electrodes of the corresponding string select gates 606.

The block of the memory device includes $N_{BL}$ separate bit lines, and the bit lines are coupled one of the current path terminals of the corresponding string select gates 606.

The block of the memory device includes a ground select line (GSL). The GSL is the control gate electrode of all the ground select gates 608 in the block.

In an alternative embodiment, the block of the memory device can include more than one ground select line, and the ground select gates 608 in the memory are divided into a different number $N_{GSL} > 1$ of distinct non-null subsets of ground select gates 608. For example, where $N_{GSL} = 2$, each of the subsets of ground select gates 608 contains half of the ground select gates of the strings 615. Each of the $N_{GSL}$ separate ground select lines is the control gate electrode of all the ground select gates in a corresponding one of the subsets of ground select gates 608.

In FIG. 5, a page is comprised of $N_{BL} \times N_{SSL}$ bits, and a block is comprised of $N_{BL} \times N_{SSL} \times N_{WL}$ bits. Where the indicator memory indicates to exclude $WL_M$, the block of the memory device identifies one active level $WL_M$ to be excluded, the number of bits in the block reduces to $N_{BL} \times N_{SSL} \times (N_{WL} - 1)$. Where the indicator memory indicates to exclude $WL_M$ and $WL_{M-1}$, the block of the memory device identifies two active levels $WL_M$ and $WL_{M-1}$ to be excluded, the number of bits in the block reduces to $N_{BL} \times N_{SSL} \times (N_{WL} - 2)$. The density of the block can be adjusted by defining the number of active levels to be excluded. The excluded level is not necessarily the lowermost active level, but can be any level of the active levels. Where a memory device defines a number $N_{EX}$ of active levels to be excluded in the all blocks, the density of the memory device is $N_{BL} \times N_{SSL} \times (N_{WL} - N_{EX}) \times N_{BLOCK}$. When $N_{EX} \geq 2$, the excluded levels can be active levels arranged in series, or can be arranged randomly.

In yet another alternative embodiment, the indicator memory can indicate ½, ¼, or ⅛ of the active levels to be excluded.

The indicator memory comprises an electrically programmed fuse (eFuse), a flash, a ROM, a RAM, or the like.

Control circuitry is coupled to the active levels. In the operation of reading or programming the 3D memory device, the control circuitry which is responsive to the indicator memory applies a first control voltage to a selected one of the active levels, applies a second control voltage to non-selected ones of the active levels, and applies a third control voltage to an excluded one of the active levels.

The first, second and third control voltages are different. The first control voltage is the program or read voltage applied to the selected active level. The second control voltage is the pass voltage (Vpass) applied to the non-selected active levels. The third control voltage is an alternative pass voltage (V'pass) applied to the excluded level.

The third control voltage can be adjusted responsive to a period of time, or to a number of cycles, depending on the information on operating time or cycles stored in the configuration register. For instance, the state machine would receive signals from the configuration register and change the third control voltage after the memory device is operated for example one year or after 1K cycles The memory device comprises a plurality of horizontal structures on a substrate; a plurality of vertical structures is orthogonally arranged with the plurality of horizontal structures; a plurality of memory cells is located at cross-points between the pluralities of vertical and horizontal structures; an indicator memory which is programmable to indicate which if any of the horizontal structures are to be excluded, and control circuitry is coupled to the plurality of horizontal structures, wherein for reading or writing of the memory device, the control circuitry which is responsive to the indicator memory applies a first control voltage to a selected one of the horizontal lines, applies a second control voltage to a non-selected one of the horizontal lines, and applies a third control voltage to an excluded one of horizontal levels.

The indicator memory is also used for erasing the memory device.

In one example, such as a 3D vertical channel structure, the plurality of horizontal structures comprises conductive material, semiconductive material, or both, and the plurality of horizontal structures may be the active levels, such as word lines. The plurality of vertical structures comprises conductive material, semiconductive material, or both, and the plurality of vertical structures may be the pillars.

In an alternative example, such as a 3D vertical gate structure, the plurality of horizontal structures comprises conductive material, semiconductive material, or both, and the plurality of horizontal structures may be the active levels, such as bit lines. The plurality of vertical structures comprises conductive material, semiconductive material, or both, and the plurality of the vertical structures may be word lines.

Reference to FIG. 5 is made in the description of a programming operation where a target cell is labeled cell A, and the excluded active level is $WL_M$. Before programming, the entire block is erased so as to lower the threshold voltages to an erase threshold, which in NAND can be a voltage level less than zero. During a program pulse for the selected cell A, the selected bit line $BL_2$ receives a bias of about 0 V, and the non-selected bit lines $BL_1$ and $BL_3$-$BL_N$ receive inhibit bias voltages. Likewise, the selected string select line $SSL_2$ receives a bias of about 3 V, and the non-selected string select lines $SSL_1$ and $SSL_3$-$SSL_P$ receive inhibit bias voltages. The selected active level $WL_1$ receives the program pulse, the non-selected active levels $WL_2$-$WL_{M-1}$ receive the pass voltages (Vpass), and the excluded active level $WL_M$ receives a different pass voltage (V'pass) than the Vpass such that the NAND string is turned on.

The pass voltage disturbance problem in a 3D NAND is greater than that in a 2D NAND, because the number of the pass voltage disturbances is proportional to the number of the SSLs. The Vpass level should be higher than the threshold voltage but less than that required for programming the cell. Due to the changes in the pillar width, the threshold voltages of cells in the excluded active levels may be higher than those of cells in the non-selected active levels, so that the V'pass can be higher than the Vpass. However, higher pass voltage will cause greater disturbance, and the cells with smaller pillar width are more readily influenced by the pass voltage disturbance. If the disturbance is sufficient to change the threshold voltages of the disturbed cells from the low threshold voltage to the high threshold voltage, then the cells in the excluded level are erased to have negative threshold, resulting in V'pass lower than Vpass.

The reading operation is similar to the programming operation when it comes to the pass voltage disturbance and to determining the pass voltages (Vpass and V'pass) applied to the non-selected active levels and excluded levels.

Figure 6:
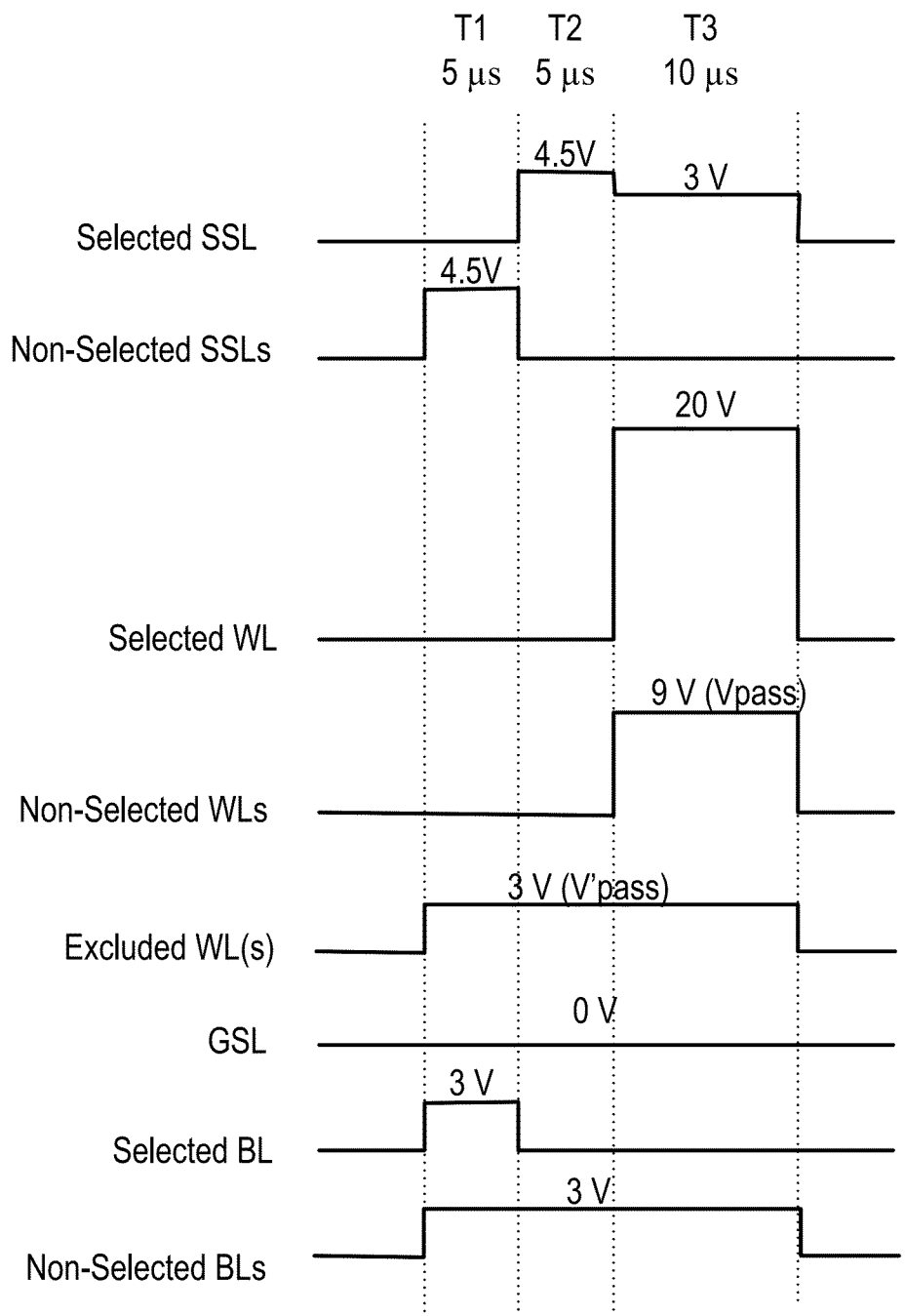
FIG. 6 is a timing diagram of a program operation in accordance with one embodiment.

FIG. 6 is a timing diagram of a programming operation which is executed in three intervals according to this embodiment.

At the beginning of phase T1, the circuitry applies sufficient voltage (for example 4.5 V) to turn on the non-selected SSLs switches and applies a low voltage about 0 V to turn off the selected SSL switch. The selected WL remains at about 0 V, as do the non-selected WLs and GSL. The circuitry also applies about 3 volts on the selected and non-selected bit lines. Because the cells are erased to have negative threshold voltages before this phase, the pass voltage (V'pass) applied to the excluded active level is at a potential about 3 V, sufficient to turn on the cells in the excluded level. At the end of phase T1, the non-selected SSLs and the selected bit line are returned to about 0 V, while voltages on the excluded WL remain at the pass voltage (V'pass) about 3 V. In one example, phase T1 can last about 5 μs.

In phase T2, the circuitry applies about 4.5 V to the SSL line to turn on the selected SSL switch. The selected bit line remains at about 0 V, as do the selected and non-selected WLs, GSL, and non-selected SSLs. The non-selected bit lines remain at about 3V. This enables current flow in the strings coupled to the selected bit line, while blocking current flow in the string coupled to the non-selected bit lines. At the end of phase T2, the voltage on the selected SSL decreases to about 3 V. In one example, phase T2 can last about 5 μs.

At the beginning of phase T3, the voltage on the selected word line level is boosted to the program potential of about 20 V (program pulse). The pass voltage is less than that the required for programming the cell A. In this example, the pass voltage (Vpass) on the non-selected WLs can be 9 V, and the pass voltage (V'pass) on the excluded WLs can be 3 V. During phase T3, cell A is programmed. In one example, phase T3 can last about 10 μs.

A method of reading or programming a 3D device as represented in FIG. 5, comprising active levels and pillars extending through the active levels, is described which comprises applying a first control voltage to a selected one of the active levels, applying a second control voltage to a non-selected one of the active levels, and applying a third control voltage, different from the second control voltage, to an excluded one of the active levels. In this method, the second control voltage turns on memory cells at the cross-points between the pillars and the non-selected one of the active levels, and the third control voltage turns on memory cells at the cross-points between the pillars and the excluded one of the active levels. The method further comprises programming an indicator memory with an indication of the active level to be excluded. The third control voltage is applied in response to an indicator memory which identifies the excluded active level. The indicator is also used for erasing the 3D device.

The first, second and third control voltages are different. The first control voltage is the program or read voltage applied to the selected active level. The second control voltage is the pass voltage (Vpass) applied to all the non-selected active levels. The third control voltage is an alternative pass voltage (V'pass) applied to the excluded level.

The foregoing description of embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas embodiments herein are described using vertical channel charge storage memory cells, pillars with other types of memory cells can make use of aspects of the invention as well, albeit without necessarily achieving all of the benefits described above. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A memory device, comprising:
  a plurality of horizontal structures on a substrate, the plurality of horizontal structures comprising conductive material, semiconductive material, or both;
  a plurality of vertical structures orthogonally arranged with the plurality of horizontal structures, the plurality of vertical structures comprising conductive material, semiconductive material, or both;
  a plurality of memory cells located at cross-points between the pluralities of vertical and horizontal structures;
  an indicator memory indicating which if any of the horizontal structures is to be excluded; and
  control circuitry coupled to the plurality of the horizontal structures,
  wherein for reading or programming of the memory device, the control circuitry which is responsive to the indicator memory applies a first control voltage to a selected one of the horizontal structures, applies a second control voltage to non-selected ones of the horizontal structures, and applies a third control voltage to an excluded one of horizontal structures.

2. The device of claim 1, wherein the first, second and third control voltages are all different.

3. The device of claim 1, wherein the second control voltages are applied to all non-selected horizontal structures.

4. The device of claim 1, wherein the first control voltage comprises a program voltage or a read voltage.

5. The device of claim 1, wherein the width of the vertical structures intersecting the excluded one of horizontal structures is smaller than the width of the vertical structures intersecting the selected and non-selected one of horizontal structures.

6. The device of claim 1, wherein the plurality of horizontal structures comprises word lines.

7. The device of claim 6, wherein the plurality of vertical structures comprises pillars.

8. The device of claim 1, wherein the plurality of horizontal structures comprises bit lines.

9. The device of claim 8, wherein the plurality of vertical structures comprises word lines.

10. A semiconductor device, comprising:
  a plurality of active levels;
  a plurality of pillars extending vertically through the plurality of active levels;
  a plurality of series-connected memory cells located at cross-points between the pluralities of pillars and the active levels; and
  control circuitry coupled to the plurality of active levels,
  wherein for reading or programming of the semiconductor device, the control circuitry applies a first control voltage to a selected one of the active levels, applies a second control voltage to non-selected ones of the active levels, and applies a third control voltage to an excluded one of the active levels.

11. The device of claim 10, wherein the device further comprises an indicator memory indicating which if any of the active levels is to be excluded.

12. The device of claim 10, wherein the first, second and third control voltages are all different.

13. The device of claim 10, wherein the second control voltage is applied to all non-selected active levels.

14. The device of claim 11, wherein the control circuitry which is responsive to the indicator memory to apply the third control voltage to an excluded one of the active levels.

15. The device of claim 10, wherein the excluded active level comprises an uppermost or lowermost layer in the plurality of the active levels.

16. The device of claim 10, wherein the width of the pillar of the active level is smaller than the width of the pillar of selected or non-selected active levels.

17. A method of reading or programming a 3D device comprising active levels and pillars extending through the active levels, comprising:
  applying a first control voltage to a selected one of the active levels;
  applying a second control voltage to a non-selected one of the active levels;
  applying a third control voltage, different from the second control voltage, to an excluded one of the active levels; and
  wherein the second control voltage turns on memory cells at the cross-points between the pillars and the non-selected one of the active levels, and wherein the third control voltage turns on memory cells at the cross-points between the pillars and the excluded one of the active levels.

18. The method of claim 17, wherein the second control voltage is applied to all non-selected active levels.

19. The method of claim 17, wherein the third control voltage is applied in response to an indicator memory which identifies the excluded active level.

20. The method of claim 17, further comprising programming an indicator memory with an indication of the active level to be excluded.

* * * * *